(12) United States Patent
Shimada et al.

(10) Patent No.: US 8,343,362 B2
(45) Date of Patent: *Jan. 1, 2013

(54) STAMPER MANUFACTURING METHOD

(75) Inventors: Takuya Shimada, Yokohama (JP);
Shinobu Sugimura, Yokohama (JP);
Yoshiyuki Kamata, Tokyo (JP);
Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 367 days.

This patent is subject to a terminal disclaimer.

(21) Appl. No.: 12/641,135

(22) Filed: Dec. 17, 2009

(65) Prior Publication Data
US 2010/0155365 A1  Jun. 24, 2010

(30) Foreign Application Priority Data

Dec. 22, 2008  (JP) ................................. 2008-326226

(51) Int. Cl.
*H01B 13/00* (2006.01)
*C25F 3/00* (2006.01)

(52) U.S. Cl. .............. 216/13; 216/11; 216/83; 264/220; 264/293

(58) Field of Classification Search ............... 216/13, 216/11, 83; 264/220, 293
See application file for complete search history.

(56) References Cited

U.S. PATENT DOCUMENTS

| 7,154,843 | B2 | 12/2006 | Nakano et al. | |
| 7,442,316 | B2 | 10/2008 | Jeong et al. | |
| 7,938,978 | B2 * | 5/2011 | Shimada et al. | 216/83 |
| 2006/0222897 | A1 | 10/2006 | Kamata et al. | |
| 2007/0018362 | A1 | 1/2007 | Heidari et al. | |
| 2007/0158872 | A1 | 7/2007 | Jeong et al. | |
| 2008/0128944 | A1 | 6/2008 | Wang et al. | |
| 2008/0131548 | A1 | 6/2008 | Gauzner et al. | |

FOREIGN PATENT DOCUMENTS

| JP | 05-144093 | 6/1993 |
| JP | H10-121237 | 5/1998 |
| JP | 10-312585 | 11/1998 |
| JP | 2000-215529 | 8/2000 |
| JP | 2003-077807 A | 3/2003 |
| JP | 2004-014061 | 1/2004 |
| JP | 2005-259264 | 9/2005 |
| JP | 2006-277868 | 10/2006 |
| JP | 2007-095116 A | 4/2007 |
| JP | 2008-012705 | 1/2008 |
| JP | 2008-254413 | 10/2008 |

OTHER PUBLICATIONS

Explanation of Non-English Language Reference(s).
Notice of Reason for Rejection mailed by Japan Patent Office on Mar. 30, 2010 in the corresponding Japanese patent application No. 2009-013472.

(Continued)

*Primary Examiner* — Nadine Norton
*Assistant Examiner* — Mahmoud Dahimene
(74) *Attorney, Agent, or Firm* — Knobbe, Martens, Olson and Bear, LLP

(57) ABSTRACT

According to one embodiment, when forming first, second, and third stampers by transferring three-dimensional patterns of a master, a height adjusting layer having a film thickness greater on the upper surface of a projection than on the bottom surface of a recess is formed between the second stamper and a second release layer, and the surface of the third stamper is etched with an acidic solution having a pH of less than 3.

3 Claims, 6 Drawing Sheets

OTHER PUBLICATIONS

Notice of Reason for Rejection mailed by Japan Patent Office on Jun. 15, 2010 in the corresponding Japanese patent application No. 2009-013472.

Notice of Reasons for Rejection mailed by the Japan Patent Office on Feb. 23, 2010 in corresponding Japanese patent app. No. 2008-326226 in 4 pages.

* cited by examiner

STAMPER MANUFACTURING METHOD

CROSS-REFERENCE TO RELATED APPLICATIONS

This application is based upon and claims the benefit of priority from Japanese Patent Application No. 2008-326226, filed Dec. 22, 2008, the entire contents of which are incorporated herein by reference.

BACKGROUND

1. Field

One embodiment of the present invention relates to a method of manufacturing a stamper to be used to produce a large number of information recording media by transferring patterns by, e.g., injection molding or imprinting.

2. Description of the Related Art

Recently, the recording capacity of an information recording apparatus is increased by increasing the recording density of a magnetic recording medium. As a magnetic recording medium having a high recording density, a discrete track recording (DTR) magnetic recording medium having patterns including a magnetic portion and nonmagnetic portion on, e.g., a plurality of concentric data recording tracks is known.

As a method of manufacturing a magnetic recording medium like this, nanoimprinting or injection molding using a nickel (Ni) stamper as a metal mold as disclosed in, e.g., Jpn. Pat. Appln. KOKAI Publication No. 2008-12705 is used.

As the recording density of the DTR magnetic recording medium increases, a stamper for use in the manufacture of the medium is requiring a micropatterning technique that forms three-dimensional patterns having a track pitch of, e.g., 100 nm or less.

When the density increases as the track pitch of the three-dimensional patterns decreases, however, the thickness of a resist layer for electron beam (EB) lithography decreases by EB lithography rate control because the lithography performance improves as the resist layer thickness decreases. This sometimes decreases the difference between the projections and recesses on the manufactured master. When using this stamper having a small difference between the projections and recesses, the three-dimensional patterns of a resist mask on a medium may become defective owing to insufficient transfer during imprinting. Also, a sufficiently wide medium projection is necessary for a narrow pitch in order to maintain the write/read performance for the projection. Therefore, finer recess patterns must be written by EB. However, the limit of an EB lithography system makes grooves of a few nm difficult to write. This makes it impossible to obtain a high-density master in the future.

The present invention has been made in consideration of the above situation, and has as its object to manufacture a stamper capable of transferring three-dimensional patterns without any defect, and having high durability.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Figure 1A:
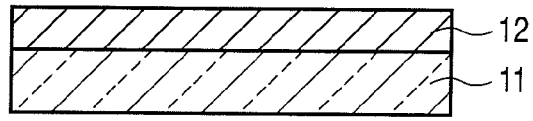
FIGS. 1A to 1H are exemplary sectional views for explaining an example of a stamper manufacturing method according to the present invention.

Various embodiments according to the invention will be described hereinafter with reference to the accompanying drawings. In general, according to one embodiment of a stamper manufacturing method of the present invention, first, second, and third stampers are formed by transferring three-dimensional patterns of a master.

First, a first conductive layer is formed on the surface of the master having the three-dimensional patterns, a first electroformed layer is formed on the first conductive layer, and the first electroformed layer and first conductive layer are separated from the master, thereby forming the first stamper having projections and recesses transferred from the master.

Subsequently, a first release layer is formed on the surface of the first stamper, a second conductive layer is formed on the first release layer, a second electroformed layer is formed on the second conductive layer, and the second electroformed layer and second conductive layer are separated from the first stamper, thereby forming the second stamper having projections and recesses transferred from the first stamper.

Furthermore, a second release layer is formed on the second stamper, a third conductive layer is formed on the second release layer, a third electroformed layer is formed on the third conductive layer, and the third electroformed layer and third conductive layer are separated from the second stamper, thereby forming the third stamper having projections and recesses transferred from the second stamper.

The stamper manufacturing method according to the present invention is characterized in that when forming the first to third stampers, a height adjusting layer having a film thickness greater on the upper surface of the projection than on the bottom surface of the recess is formed between the second stamper and second release layer, and the surface of the third stamper is etched with an acidic solution having a pH of less than 3.

When using the present invention, the height adjusting layer having a film thickness greater on the upper surface of the projection than on the bottom surface of the recess is formed between the second stamper and second release layer. Even when the difference between the projections and recesses of the master is small, therefore, it is possible to increase the difference between the projections and recesses of the finally formed stamper. When the difference between the projections and recesses of the master can be decreased, a resist layer can be thinned. Accordingly, even if high-density patterns are written on the resist layer by EB lithography when forming the master, high lithography performance can be obtained.

Also, in the present invention, the difference between the projections and recesses of the stamper is increased by forming the height adjusting layer, and this stamper is etched. This makes it possible not only to thin the projection of the three-dimensional patterns, but also to decrease the rectangularity of the three-dimensional patterns. When the rectangularity decreases, the corners are rounded. When manufacturing a recording medium by using the stamper having the three-dimensional patterns having the thinned projections and rounded corners, an ultraviolet-curable resin layer and the stamper are easily adhered and separated in an imprinting step. Since this reduces damage to the stamper and transferred patterns, the durability of the stamper can increase.

The present invention will be explained in more detail below with reference to the accompanying drawing.

FIRST EMBODIMENT

FIGS. 1A to 1H are exemplary sectional views for explaining a stamper manufacturing method according to the first embodiment of the present invention.

This stamper is manufactured by the following process by using, e.g., a coating apparatus, lithography apparatus, developing apparatus, film formation apparatus, and electroforming apparatus.

First, as shown in FIG. 1A, a substrate 11 such as a glass or Si substrate is spin-coated with a resist by the coating apparatus such as a spin coating apparatus, thereby forming a resist layer 12.

Figure 1B:
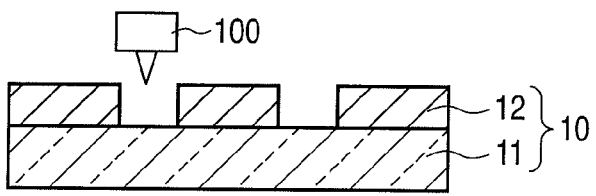

Then, as shown in FIG. 1B, the resist layer formed by the coating apparatus is irradiated with an electron beam (EB) by the lithography apparatus such as an EB lithography apparatus 100, thereby forming a latent image. In addition, three-dimensional patterns are formed by developing, by the developing apparatus, the resist layer 12 having the latent image formed by the EB lithography apparatus. A master 10 is obtained by the series of steps described above.

Figure 1C:
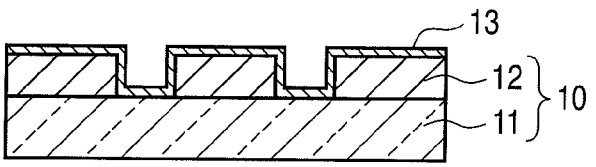
Figure 1D:
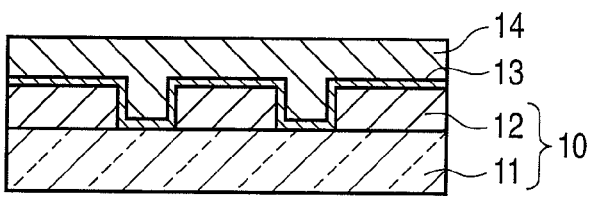
Figure 1E:
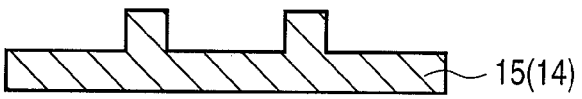

Subsequently, as shown in FIG. 1C, a conductive film 13 is formed on the three-dimensional patterns of the master 10 by the film formation apparatus. Also, as shown in FIG. 1D, a nickel electroformed layer 14 is formed on the conductive film 13 by electroplating by using the electroforming apparatus. The layer including the conductive film 13 and electroformed layer 14 is separated from the master 10, thereby forming a father stamper 15 as a first stamper shown in FIG. 1E.

Figure 1F:
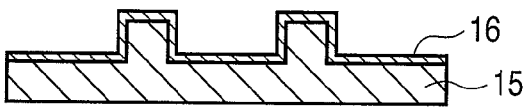
Figure 1G:
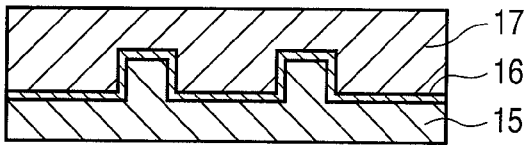
Figure 1H:
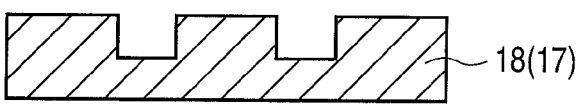

As shown in FIG. 1F, an oxide film 16 is formed as a release layer on the three-dimensional patterns of the father stamper 15 by, e.g., anodic oxidation or oxygen plasma asking. After that, as shown in FIG. 1G, an Ni electroformed layer 17 is formed on the oxide film 16 and separated from it, thereby duplicating a mother stamper 18 as a second stamper shown in FIG. 1H.

Figure 2A:
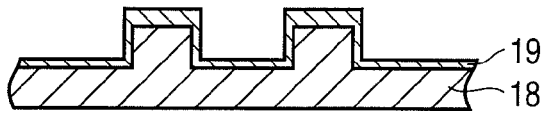
FIGS. 2A to 2F are exemplary sectional views for explaining the example of the stamper manufacturing method according to the present invention.

The mother stamper 18 thus manufactured undergoes processing of the present invention, which increases the difference between the projections and recesses of the three-dimensional patterns, i.e., which increases the difference between the bottom of the recess and the top of the projection. In this processing, as shown in FIG. 2A, a thin conductive film 19 is formed as a height adjusting layer on the three-dimensional patterns of the mother stamper 18. This height adjusting layer has a film thickness greater on the upper surface of the projection than on the bottom surface of the recess. More specifically, a stamper having three-dimensional patterns having a projection/recess pitch, i.e., a track pitch of 93.6 nm, a groove width of 30 nm, and a groove depth of 50 nm is used as the mother stamper 18, and the thin conductive film 19 made of nickel is formed on the three-dimensional pattern surface of the mother stamper 18 by sputtering or the like. When the film was formed at a system internal pressure of 1.0 Pa and a discharge power of 100 W for a film formation time of 120 seconds by using, e.g., a DC sputtering apparatus, the film thickness was 5 nm on the bottom surface of a recess and 10 nm on the upper surface of a projection. That is, it was possible to make the film thickness on the projection upper surface greater than that on the recess bottom surface, and make the difference between the heights of the projections and recesses of the three-dimensional patterns greater by 5 nm than that before the processing.

The thin conductive film 19 may also be formed on the sidewalls of the projections and recesses. Also, this processing step is desirably executed immediately after the mother stamper 18 is separated from the father stamper 15. This is so because if the time elapses, the surface of the mother stamper 18 may oxidize to make stable formation of the thin conductive film 19 impossible.

Figure 2B:
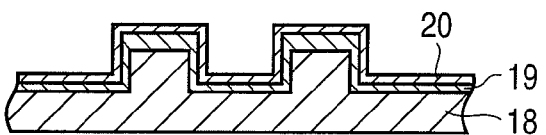
Figure 2C:
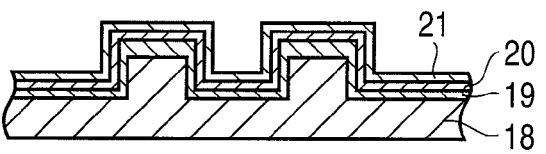

As shown in FIG. 2B, a release layer 20 is formed on the surface of the thin conductive film 19 by, e.g., oxygen reactive ion etching (RIE) or an ultraviolet (UV) radiation apparatus. Subsequently, as shown in FIG. 2C, a nickel transfer film 21 for etching is formed on the release layer 20. More specifically, the transfer film is formed by sputtering or the like so as to be narrower by 10 nm than a pattern groove width of 30 nm. In this case, when film formation was performed at a system internal pressure of 0.5 Pa and a discharge power of 100 W for a film formation time of 60 seconds by using, e.g., a DC sputtering apparatus, a 5-nm-thick sputtered film was uniformly formed because the system internal pressured was different from that when the thin conductive film 19 was formed.

Figure 2D:
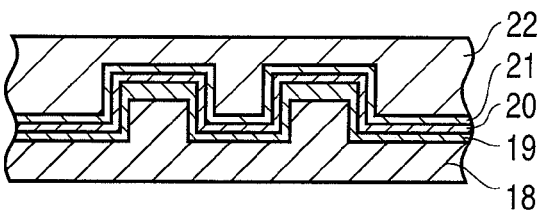
Figure 2E:
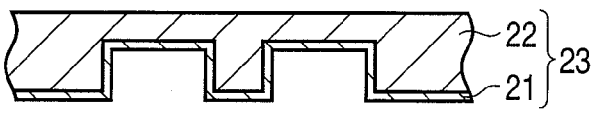

Then, as shown in FIG. 2D, an electroformed layer 22 about 300 μm thick was formed by electroforming by dipping the obtained structure in a nickel sulfamate solution. After that, the electroformed layer 22 is separated from the mother stamper 18, thereby duplicating a son stamper 23 as a third stamper having the transfer film 21 and electroformed film 22 integrated with each other as shown in FIG. 2E.

Figure 3:
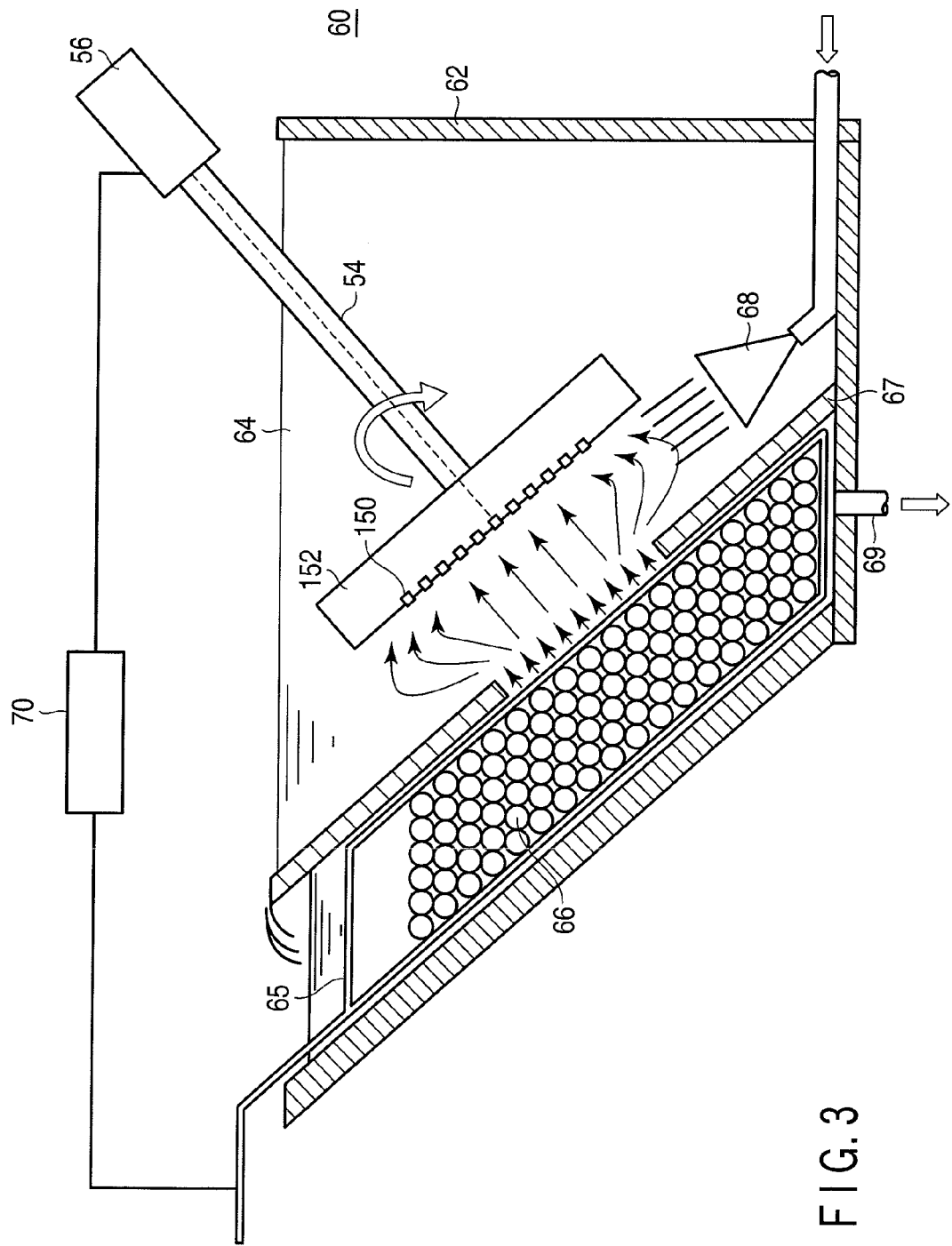
FIG. 3 is an exemplary view of an electroforming apparatus usable in the present invention.

More specifically, when forming an electroformed layer on the master, father stamper, or mother stamper (to be referred to as a base 150 hereinafter) having three-dimensional patterns as shown in FIG. 3, the outer periphery of the base 150 is held by a jig 152. The jig 152 is supported by a rotational shaft 54 that can be rotated by a motor 56. That is, the base 150 held by the jig 152 is rotated by the motor 56. The base 150 held by the jig 152 is dipped in a plating solution 64 in a vessel 62 of an electroforming apparatus 60. A case 65 in which Ni pellets 66 are deposited is dipped in the plating solution 64 in the electroforming bath 62 of the electroforming apparatus 60. In the vessel 62, the case 65 is isolated from the side on which the base 150 is dipped in the plating solution 64 by a partition plate 67 having an opening. Note that the base 150 to be plated is set to be opposed to the opening in the partition plate 67. A rectifier 70 applies a positive potential to the case 65 and a negative potential to the base 150, and a discharge nozzle 68 discharges a plating solution supplied from a control bath (not shown) through a filter to a portion between the opening and base 150, thereby forming an electroformed layer on the base 150. The plating solution discharged from the discharge nozzle 68 fills the room on the side of the base 150 partitioned by the partition plate 67, and overflows and fills the room on the side of the case 65 after that. The plating solution is then returned to the control bath (not shown) from a drain 69 so as to match the discharge amount. The plating solution is thus circulated.

Figure 2F:
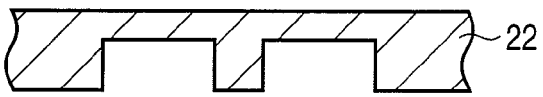

An etched son stamper 24 is obtained by etching the son stamper 23 obtained as described above. More specifically, the patterns are thinned by 5 nm by using an acidic solution having a pH of less than 3. For example, when the separated son stamper 23 was dipped in an aqueous sulfamic acid solution having a pH of 2.0 and left to stand for 15 minutes, the 5-nm-thick transfer film 21 was mainly etched as shown in FIG. 2F. Consequently, it was possible to make the pattern groove width smaller by 10 nm than that before the processing.

As the acidic solution, an aqueous sulfamic acid solution or the like can be used. It is also possible to use, e.g., an aqueous nitric acid solution, aqueous sulfuric acid solution, sulfuric acid/hydrogen peroxide solution, aqueous hydrochloric acid solution, ferric chloride solution, copper (II) chloride solution, sodium peroxodisulfate solution, or ammonium peroxodisulfate solution.

After that, a protective film is formed on the three-dimensional pattern surface by spin coating, and dried. A stamper as a final form for transferring a large number of media is completed through steps such as back surface polishing and punching as needed.

As the thin conductive film 19 and transfer film 21 described above, a material mainly containing Ni can be used because Ni has high physical and mechanical strength, high resistance to corrosion and abrasion, and high adhesion to Ni of the electroforming material. As the electroformed layer 22, it is possible to use Ni or a material containing Ni and Co, S, B, or P.

SECOND EMBODIMENT

A mother stamper 18 is duplicated following the same procedures as in the first embodiment. More specifically, a stamper having three-dimensional patterns having a projection/recess pitch, i.e., a track pitch of 83.2 nm, a groove width of 30 nm, and a groove depth of 50 nm is used as the mother stamper 18, and a thin conductive film 19 is formed on the three-dimensional pattern surface of the mother stamper 18 by sputtering or the like. When the film was formed at a system internal pressure of 1.0 Pa and a discharge power of 100 W for a film formation time of 45 seconds by using, e.g., a DC sputtering apparatus, the film thickness was 5 nm on the bottom surface of the recess and 7 nm on the upper surface of the projection. That is, it was possible to make the film thickness on the projection upper surface greater than that on the recess bottom surface, and make the difference between the heights of the projections and recesses of the three-dimensional patterns greater by 2 nm than that before the processing.

The thin conductive film 19 may also be formed on the sidewalls of the projections and recesses. Also, this processing step is desirably executed immediately after the mother stamper 18 is separated from a father stamper 15. This is so because if the time elapses, the surface of the mother stamper 18 may oxidize to make stable formation of the thin conductive film 19 impossible.

Then, as shown in FIG. 2B, a release layer 20 is formed on the surface of the thin conductive film 19 by, e.g., oxygen reactive ion etching (RIE) or an ultraviolet (UV) radiation apparatus. Subsequently, as shown in FIG. 2C, a transfer film 21 for etching is formed on the release layer 20. More specifically, the transfer film is formed by sputtering or the like. When film formation was performed at a system internal pressure of 0.5 Pa and a discharge power of 100 W for a film formation time of 45 seconds by using, e.g., a DC sputtering apparatus, a 3-nm-thick nickel sputtered film was formed on the sidewalls.

Then, as shown in FIG. 2D, an electroformed layer 22 about 300 µm thick was formed by electroforming by dipping the obtained structure in a nickel sulfamate solution. After that, the electroformed layer 22 is separated from the mother stamper 18, thereby duplicating a son stamper 23 as a third stamper having the transfer film 21 and electroformed film 22 integrated with each other as shown in FIG. 2E.

The son stamper 23 thus obtained was dipped in an aqueous sulfamic acid solution having a pH of 2.0 and left to stand for 10 minutes, a 3-nm-thick transfer film was mainly etched as shown in FIG. 2F. Consequently, it was possible to make the pattern groove width smaller by 6 nm than that before the processing.

As described above, the thin conductive film 19 was formed on the three-dimensional pattern surface of the mother stamper 18 so as to make the film thickness on the projection upper surface greater than that on the recess bottom surface, thereby increasing the difference between the heights of the projections and recesses of the three-dimensional patterns. This makes it possible to increase the difference between the heights of the projections and recesses of the three-dimensional patterns of the son stamper 23 duplicated from the mother stamper 18. In addition, an etched stamper 24 having thinned three-dimensional patterns is obtained by isotropically etching the transfer film on the surface of the son stamper.

Furthermore, a stamper having no pattern defect can be obtained by properly setting the conditions of the formation of the thin conductive film and transfer film on the mother stamper, and the conditions of the etching of the mother stamper.

COMPARATIVE EXAMPLE

For comparison, a thin Ni conductive film was formed as a transfer film on the three-dimensional pattern surface of a mother stamper by sputtering or the like. That is, when film formation was performed at a system internal pressure of 1.0 Pa and a discharge power of 100 W for a film formation time of 60 seconds by using, e.g., a DC sputtering apparatus, an 8-nm-thick film was formed on both the bottom surface of the recess and the upper surface of the projection.

Then, an electroformed layer about 300 µm thick was formed by electroforming by dipping the obtained structure in a nickel sulfamate solution. After that, a son stamper for comparison was duplicated by separating the electroformed layer from the mother stamper.

When obtaining the desired three-dimensional shape by only forming the thin conductive film on the mother stamper, the aspect ratio extremely increases. Since this increases the force applied on the pattern portion when separating the son stamper, a pattern defect readily occurs. Also, isotropic etching of the son stamper alone produces no difference between the heights of projections and recesses. To obtain the desired pattern shape, therefore, the etching time prolongs, and the electroformed layer inside the transfer film is also etched. This worsens the pattern roughness. This is so because the transfer film formed by sputtering has a small crystal grain size, but the electroformed film formed by electroforming has a large crystal grain size and roughens the surface when etched. In the worst case, the patterns themselves become defective.

An example of a DTR medium manufacturing method will be briefly explained below with reference to FIGS. 4A to 4F.

DTR media were manufactured by the method shown in FIGS. 4A to 4F by using the stampers according to the first embodiment, second embodiment, and comparative example.

Figure 4A:
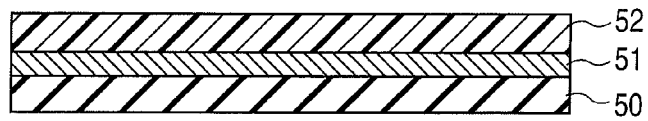
FIGS. 4A to 4F are exemplary sectional views showing an example of a process of manufacturing a magnetic recording medium using the present invention.
Figure 4B:
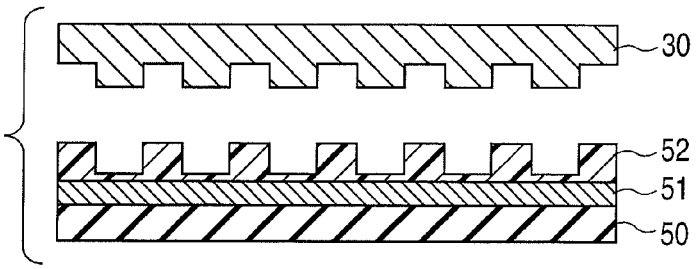
Figure 4C:
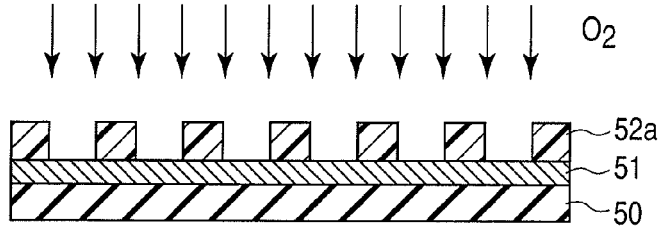
Figure 4D:
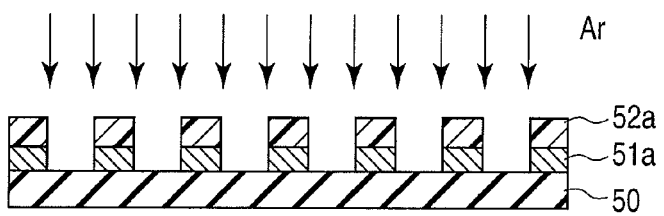
Figure 4E:
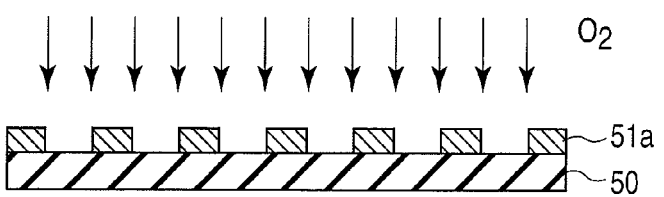
Figure 4F:
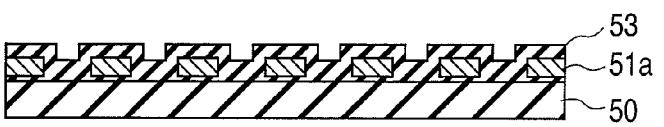

As shown in FIG. 4A, a magnetic layer 51 is formed on a substrate 50 and coated with a resist 52. As the substrate, it is possible to use, e.g., a glass substrate, an Al-based alloy substrate, ceramic, carbon, an Si single-crystal substrate having an oxidized surface, or a substrate obtained by plating any of these substrates with NiP or the like. Examples of the glass substrate are amorphous glass and crystallized glass. As the amorphous glass, soda-lime glass or alumino silicate glass can be used. As the crystallized glass, lithium-based crystallized glass can be used. As the ceramic substrate, it is possible to use, e.g., a general-purpose sintered product mainly containing, e.g., aluminum oxide, aluminum nitride, or silicon nitride, or a fiber-reinforced product of the sintered product. As the substrate, it is also possible to use a substrate obtained by forming an NiP layer on the surface of any of the above-mentioned metal and nonmetal substrates by using plating or sputtering. Although sputtering alone will be taken as an example of a method of forming a thin film on a substrate, the same effect can be obtained by e.g., vacuum evaporation or electroplating. As a magnetic layer and perpendicular magnetic recording layer, it is possible to use, e.g., a material containing Co as a main component, containing at least Pt, and further containing an oxide. As this oxide, it is possible to use, e.g., silicon oxide or titanium oxide. Magnetic grains (magnetic crystal grains) can be dispersed in the perpendicular magnetic recording layer. The magnetic grain can have a columnar structure vertically extending through the perpendicular magnetic recording layer. Then, as shown in FIG. 4B, the pattern surface of a stamper 30 having three-dimensional patterns is opposed to the resist 52, and the patterns of the stamper 30 are transferred onto the resist 52 by imprinting. In this imprinting, the patterns of the stamper are transferred onto the resist by curing it while the stamper is pressed against the substrate coated with the resist. The stamper and substrate are set so as to oppose the three-dimensional surface of the stamper to the resist film side of the substrate. Note that a general resist material mainly containing, e.g., a UV-curable resin or novolak can be used as the resist. When using the UV-curable resin, the stamper material can be a light-transmitting material such as quartz or resin. The resist can be cured by ultraviolet radiation. Ultraviolet light can be emitted by using a high-pressure mercury lamp. When using the general resist mainly containing novolak or the like, a material such as quartz, Si, or SiC can be used as the stamper material. The resist can be cured by applying, e.g., heat or pressure. Subsequently, as shown in FIG. 4C, a resist residue remaining in recesses of the resist 52 is removed by reactive ion etching using oxygen gas. As a plasma source, it is possible to use an inductively coupled plasma (ICP) that can be generated as a high-density plasma at a low pressure. It is also possible to use an electron cyclotron resonance (ECR) plasma or general parallel-plate RIE apparatus. As shown in FIG. 4D, a patterned resist 52a is used as a mask to etch the magnetic layer 51 by ion milling. As shown in FIG. 4E, the residual resist 52a is removed by oxygen asking. As shown in FIG. 4F, a nonmagnetic material is buried in the recesses as needed, and a protective film 53 is formed on the entire surface. In this manner, the DTR medium can be manufactured. The protective layer is formed to prevent corrosion of the perpendicular magnetic recording layer, and prevent damage to the medium surface when a magnetic head comes in contact with the medium. Examples of the material are materials containing C, $SiO_2$, and $ZrO_2$. The thickness of the protective layer can be 1 to 10 nm.

The three-dimensional shape of the son stamper manufactured by the present invention had rectangularity lower than that of the conventional shape, and this greatly reduced defects upon separation. Consequently, the imprinting durability became five times as high as that of the conventional shape.

Figure 5:
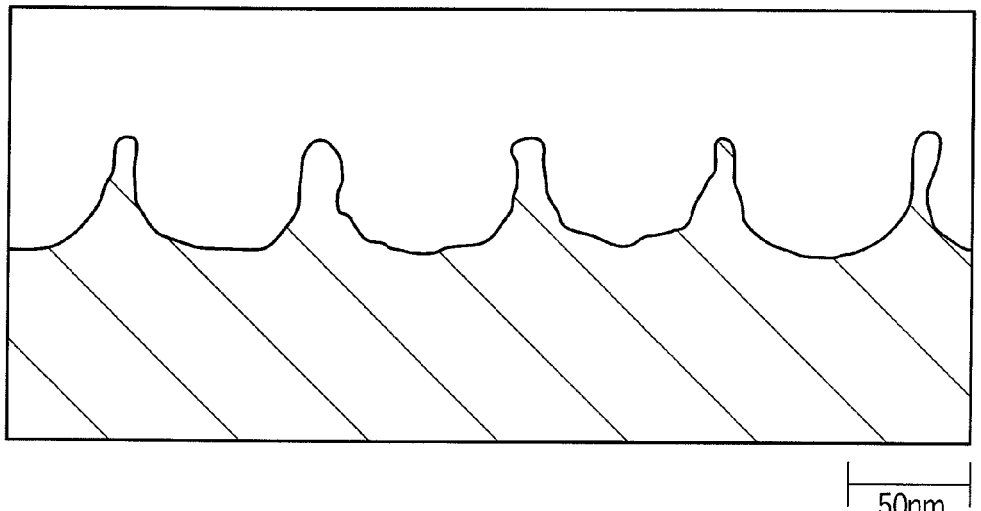
FIG. 5 is an exemplary sectional view showing an example of a stamper according to the present invention.

FIG. 5 is an exemplary sectional view of the stamper manufactured in Example 2.

Figure 6:
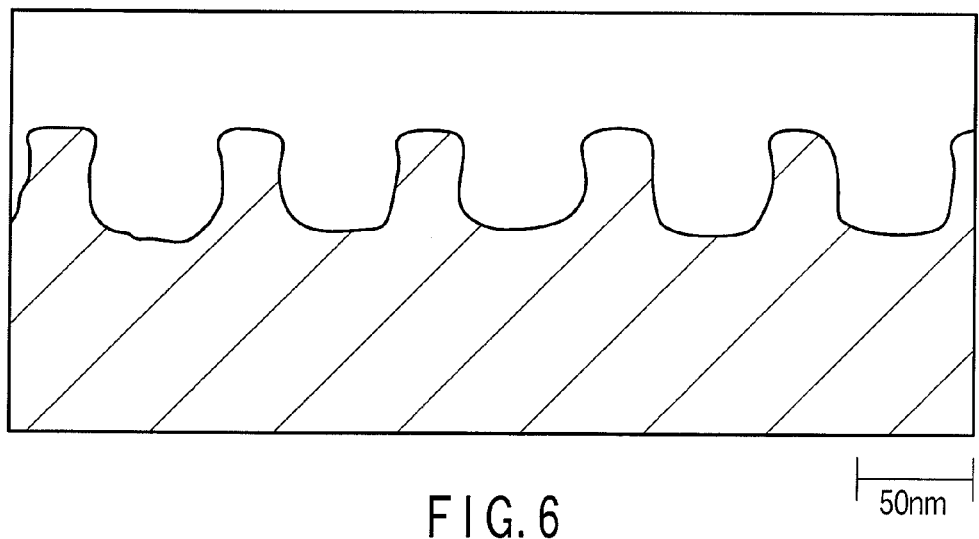
FIG. 6 is an exemplary sectional view showing a stamper according to a comparative example.

FIG. 6 is an exemplary sectional view of the stamper described in the comparative example.

The rectangularity of the stamper of the comparative example is obviously higher than that of the stamper shown in FIG. 5.

The imprinting durability was evaluated by the repeatable runout (RRO), i.e., so-called synchronization distortion of the imprinted medium.

Media were imprinted and processed under the same conditions by using the stampers manufactured in the second embodiment and comparative example. The 10th medium was compared with the 150th medium in Example 2 and the 30th medium in Comparative Example 1. Consequently, the medium RRO of the 30th medium was worse than that of the 10th medium in Comparative Example 1, but the medium RRO of the 150th medium was not so worse than that of the 10th medium in Example 2.

Also, a duplicated stamper having higher and finer patterns can be obtained by using the obtained son stamper as a master stamper, and repeating these processes. Furthermore, a large number of imprinting resin stampers can be obtained by injection molding from a stamper having inverse patterns duplicated from the obtained son stamper, or from a mother stamper manufactured from the obtained son stamper by forming a thin height adjusting film and release layer.

Figure 7:
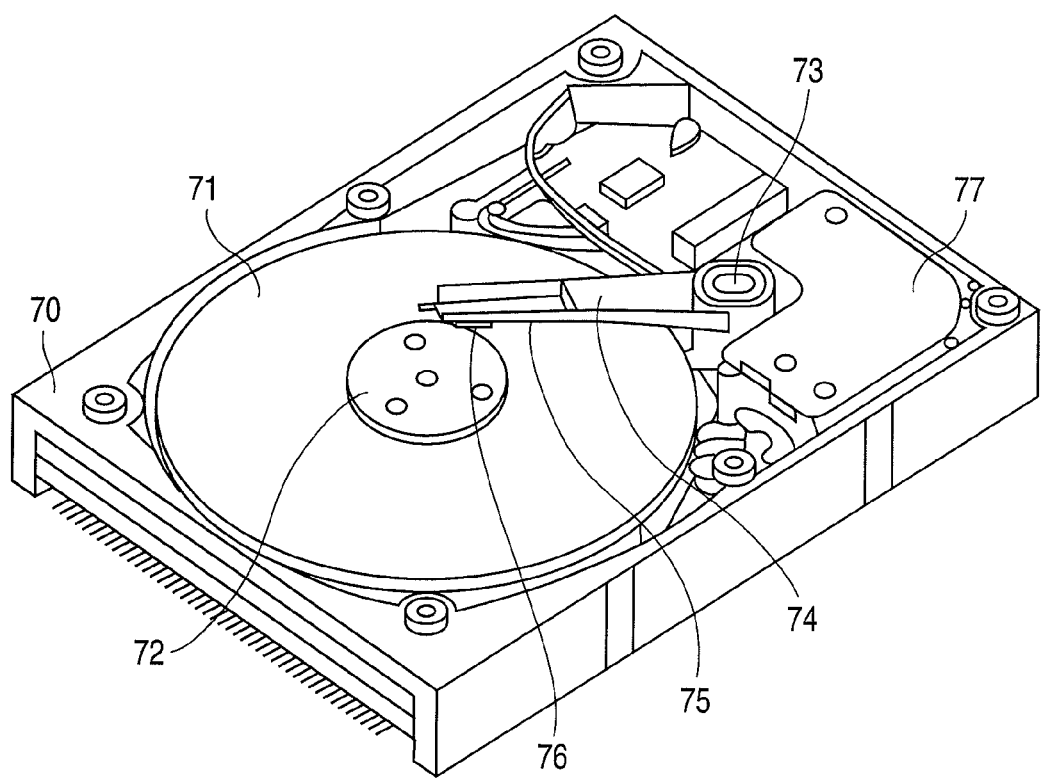
FIG. 7 is a view showing an example of a magnetic recording/reproduction apparatus capable of incorporating the magnetic recording medium using the present invention.

FIG. 7 is a schematic view showing an example of a magnetic recording/reproduction apparatus that can be formed by using the present invention.

A magnetic recording apparatus as shown in FIG. 7 was manufactured by using the obtained DTR medium. This magnetic recoding apparatus includes, inside a housing 70, a discrete type magnetic recording medium 71 described above, a spindle motor 72 for rotating the discrete type magnetic recording medium 71, a head slider 76 incorporating a magnetic head, a head suspension assembly which supports the head slider 76 and includes a suspension 75 and actuator arm 74, and a voice coil motor (VCM) 77 as an actuator of the head suspension assembly.

The spindle motor 72 rotates the discrete type magnetic recording medium 71. A magnetic head including a write head and read head is incorporated into the head slider 76. The actuator arm 74 is attached to a pivot 73 so as to be able to pivot. The suspension 75 is attached to one end of the actuator arm 74. The head slider 76 is elastically supported via a gimbal formed on the suspension 75. The voice coil motor (VCM) 77 is formed on the other end of the actuator arm 74. The VCM 77 generates torque that rotates the actuator arm 74 around the pivot 73, and positions the actuator arm 74 in a floated state in an arbitrary radial position of the discrete type magnetic recording medium 71.

Note that the present invention is not limited to the above embodiments, and can be variously modified when practiced without departing from the spirit and scope of the invention. Note also that some of the shapes, numerical values, and the like of the above-mentioned embodiments are different from the actual ones, but they can be appropriately changed when designed in consideration of well-known techniques.

Furthermore, the above embodiments include inventions in various stages, so various inventions can be extracted by properly combining a plurality of disclosed constituent elements. For example, even when some of all the constituent elements disclosed in the embodiments are deleted, an arrangement from which these constituent elements are deleted can be extracted as an invention, provided that the problem described in the section of the problem to be solved by the invention can be solved, and that the effect described in the section of the effect of the invention is obtained.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A stamper manufacturing method comprising:
    forming a first conductive layer on a surface of a master comprising projections and recesses;
    forming a first electroformed layer on the first conductive layer;
    removing the first electroformed layer and the first conductive layer from the master, thereby forming a first stamper comprising projections and recesses transferred from the master;
    forming a first release layer on a surface of the first stamper;
    forming a second conductive layer on the first release layer;
    forming a second electroformed layer on the second conductive layer;
    removing the second electroformed layer and the second conductive layer from the first stamper, thereby forming a second stamper comprising projections and recesses transferred from the first stamper;
    forming a height adjusting layer on a surface of the second stamper, the height adjusting layer being thicker on an upper surface of the projection than on a bottom surface of the recess;
    forming a second release layer on the height adjusting layer;
    forming a third conductive layer on the second release layer;
    forming a third electroformed layer on the third conductive layer;
    removing the third electroformed layer and the third conductive layer from the second stamper, thereby forming a third stamper comprising projections and recesses transferred from the second stamper; and
    etching a surface of the third conductive layer by applying an acidic solution comprising a pH of smaller than 3 on the surface.

2. The method of claim 1, wherein the height adjusting layer is formed by sputtering.

3. The method of claim 2, wherein a ratio of a thickness on the bottom surface of the recess to a thickness on the upper surface of the projection of the height adjusting layer is adjusted by adjusting an internal pressure of a sputtering apparatus.

* * * * *